United States Patent [19]

Montress et al.

[11] 4,328,473
[45] May 4, 1982

[54] ISOLATED GATE, PROGRAMMABLE INTERNAL MIXING SAW SIGNAL PROCESSOR

[75] Inventors: Gary K. Montress; Thomas W. Grudkowski, both of Glastonbury, Conn.

[73] Assignee: United Technologies Corporation, Hartford, Conn.

[21] Appl. No.: 203,179

[22] Filed: Nov. 3, 1980

[51] Int. Cl.³ .............. H03H 9/64; H03H 9/76; H03H 15/00
[52] U.S. Cl. .................. 333/154; 333/166; 333/196
[58] Field of Search .................. 333/150–155, 333/193–196, 166, 165; 331/107 A; 310/313 R, 313 A, 313 B, 313 C, 313 D; 364/821; 357/26

[56] References Cited

U.S. PATENT DOCUMENTS

| | | | |
|---|---|---|---|
| 3,691,406 | 9/1972 | Mize | 357/26 X |
| 4,065,736 | 12/1977 | London | 333/150 X |
| 4,207,546 | 6/1980 | Grudkowski | 333/196 X |
| 4,233,573 | 11/1980 | Grudkowski | 333/152 X |

Primary Examiner—Marvin L. Nussbaum
Attorney, Agent, or Firm—M. P. Williams

[57] ABSTRACT

A SAW signal processor (20) includes a plurality of FET taps (30–32) having individually programmable source-drain bias (42–44) which controls both the amplitude and phase of the mixing efficiency of internal product mixing of the waves passing beneath the tap, in dependence upon the amplitude and polarity of the bias, the sources (34) of the taps may be interconnected so as to provide a summation of correlation at the output (40). The gates (35) of each of the taps are ohmically isolated, thereby to mitigate intertap interaction. The invention is a direct improvement over U.S. Pat. No. 4,207,546.

2 Claims, 2 Drawing Figures

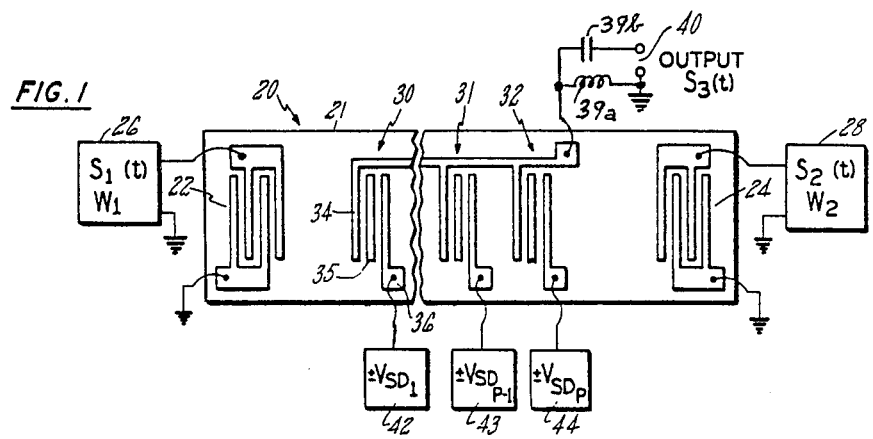
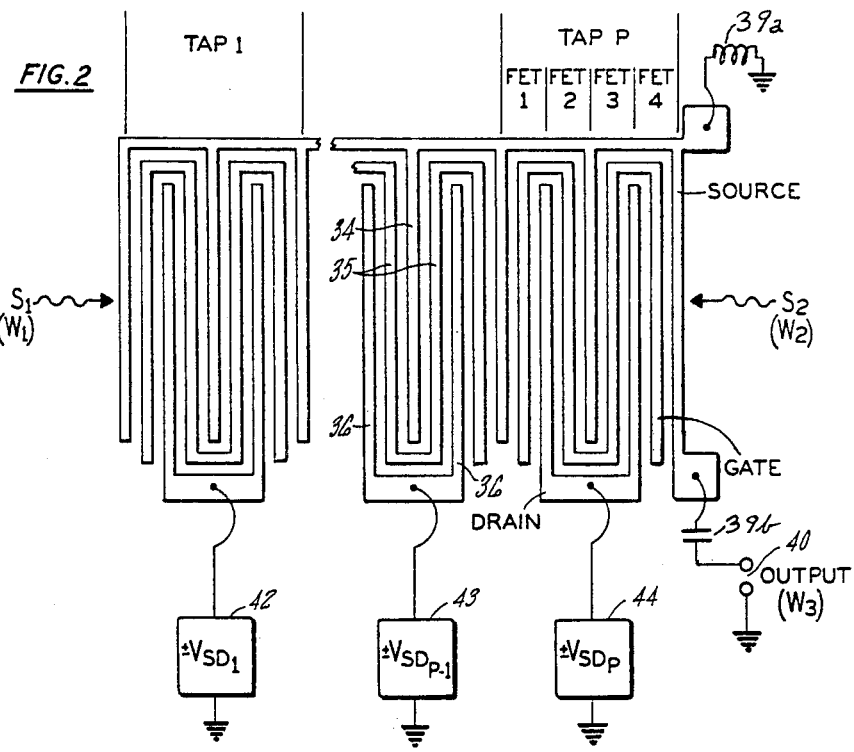

ISOLATED GATE, PROGRAMMABLE INTERNAL MIXING SAW SIGNAL PROCESSOR

The Government has rights in this invention pursuant to Contract No. F19628-79-C-0056 awarded by the Department of the Air Force.

DESCRIPTION

Technical Field

This invention relates to surface acoustic wave signal processors having FET taps, separately programmable to provide product mixing beneath each tap in which the mixer efficiency is controllable in amplitude and in phase, and more particularly to reducing interaction between taps by isolating the gates thereof.

Background Art

As is known, a variety of complex signal processing, involving a variety of signal combining/comparing functions, is achievable with phase and amplitude programmable, general transversal filters. In order to reduce size, cost and weight, as well as spurious effects in signal conduction, a SAW signal processor employing a plurality of FET taps which are individually programmable in biphase and amplitude, has been described in U.S. Pat. No. 4,207,546, the entirety of which is incorporated herein by reference. In that device, each tap of a biphase and amplitude programmable, general transversal filter includes at least one FET, the sources of all of the FETs being connected in common, the drains of the taps being separately biased to provide desired source-drain bias voltages of either polarity, and the gates of all the taps being connected together and collecting the output signals in a series fashion. As described therein, the invention of the aforementioned patent may be practiced in a variety of ways. However, it has since been noticed that there is an interaction between taps which occurs whenever the biphase programming of adjacent taps is opposite in sense. In addition, a certain amount of coupling between the taps renders the application of correct amplitude weightings to the various taps an empirical process, since there is interaction between taps which requires tailoring of the weightings in dependence upon the patterns of weightings which are used. But in cases where adjacent taps have opposite polarity bias supplied thereto, the actual tap weighting is different than the applied voltage and polarity would indicate, due to the coupling or interaction between adjacent taps. Therefore, although the device of the aforementioned patent is extremely significant in providing a wholly new type of surface acoustic wave signal processor, there are some conditions under which it is less than optimally useful.

Disclosure of Invention

Objects of the invention include provision of a phase and amplitude programmable internal mixing SAW signal processor having improved tap isolation and predictability of response.

According to the present invention, a SAW signal processor employs a plurality of taps, each comprising at least one field effect transistor, the source-drain bias of which is controlled to provide nonlinear product mixing of waves beneath the tap in which the mixer efficiency is controllable in phase and amplitude by the polarity and magnitude of the source-drain bias for the respective tap, the gates of the taps being ohmically isolated from the gates of all other taps. According to the invention, the drains of each tap are separately biased, whereas the sources of all of the taps are connected together and the output may be taken serially from the common sources.

The invention adds to the art expressed in the aforementioned patent the isolation of the individual taps from each other, thereby providing completely unfettered biphase and amplitude programmability, which results from providing the taps with gates which are ohmically isolated from the gates of every other tap. The invention may practice all of the teachings of the aforementioned patent, and is readily implemented in the light of the teachings which follow hereinafter.

Other objects, features and advantages of the present invention will become more apparent in the light of the following detailed description of exemplary embodiments thereof, as illustrated in the accompanying drawing.

Brief Description of Drawing

FIG. 1 is a simplified plan view of a SAW signal processor in accordance with the present invention; and FIG. 2 is a simplified plan view of exemplary alternative, multi-FET tap structures which may be incorporated into the SAW signal processor illustrated in FIG. 1.

Best Mode for Carrying Out the Invention

Referring now to the drawing, an exemplary, generalized embodiment of the invention is illustrated in simplified form in FIG. 1. Therein, a SAW processor 20 includes a suitable piezoelectric and semiconductive substrate 21 such as gallium arsenide, having a major surface with suitable conductive circuit elements disposed thereon so as to provide a pair of piezoelectric transducers 22, 24 for launching waves in response to respective sources 26, 28 which may correspond to a biphase coded or biphase and amplitude coded signal $S_1(t)$ varying as a function of time at a first frequency $W_1$ and a carrier signal $S_2(t)$ varying as a function of time at a second frequency $W_2$. The substrate 21 also has a plurality of taps 30-32 formed on the surface thereof between the two transducers 22, 24. Each of the taps 30-32 comprises a field effect transducer including a source 34, a gate 35 and a drain 36. The embodiment of FIG. 1 as described thus far is essentially the same as that described with respect to FIG. 1 in my aforementioned patent.

In accordance with the invention, the gate 35 in each of the taps 30-32 is ohmically isolated. That is, there is no ohmic connection to other gates or other elements of the transducer. The only relationship is that each of the gates forms a rectifying junction with the substrate, and is therefore responsive to the electric fields of the surface acoustic waves in the substrate. The source 34 of each of the FET taps (such as tap 30) is interconnected by suitable metallization with the sources of the other taps (such as taps 31, 32). The common sources are provided DC coupling to ground through any suitable isolation means such as an RF choke 39a, and are RF coupled, through a suitable means such as a capacitor 39b, to output terminals 40.

Programmable tap control is provided by individual source-drain base sources 42-44 respectively corresponding to each of the taps, each of the bias sources 42-44 being individually connected to the drain 36 of a corresponding tap 30-32. Each of these sources is controllable from zero to maximum bias in either of two polarities (plus or minus) to provide full biphase and amplitude programming of the SAW processor so as to form a transversal filter programmable both in amplitude and in phase, directly within the device itself.

The present invention differs from that described in the aforementioned patent by providing taps 30-32, each of which has totally ohmically isolated gates 35. According to an aspect of the invention, it has been determined that programmable product mixer efficiency within each of the FET taps 30-32, as a function of the amplitude and phase of the source-drain bias across such tap, is available to provide nonlinear control over the RF source-drain current components of such a tap, so that the taps will provide, in series, components resulting from the controlled mixer efficiency in the corresponding taps. Another way of looking at it is that there is a gate voltage or charge on the gates 35 of each of the taps 30-32 which is in fact dependent upon the electric fields of the surface acoustic waves in the substrate, and, the effect of the gate voltage or charge on source-drain conduction of each of the taps is nonlinear, thereby producing product mixing which is utilized in the programmable transversal filter of the invention. The general relationships between the waves in the substrate and the FET taps are all set forth in great detail in the aforementioned patent, and are applicable here. The only distinction is that the output is sensed by a different relationship within the FET of each of the taps 30-32, mainly the RF source-drain current (rather than the gate voltage).

Referring now to FIG. 2, a more complicated and perhaps more useful embodiment of the invention is similar to that described with respect to FIG. 6 in the aforementioned patent. In FIG. 2, each of the taps has a pair of drain fingers, and four interconnected gate fingers so as to provide four distinct FETs with respect to each tap. However, in accordance with the invention, the gate of each FET in a given tap is connected only to gates of other FETs of the tap, which is permissible because each tap will have the same source-drain bias applied to each FET of the tap. But, the gate structure of any one tap is ohmically isolated from the rest of the device, in the same fashion as the embodiment of FIG. 1.

The details of providing a structure in accordance with the invention, including variations, such as forming a piezoelectric and semiconductive substrate by means of a film of zinc oxide on silicon, the methods for forming the transducers 22, 24, and the various ways of utilizing the invention may all be as set forth in the aforementioned patent and are not repeated here.

Similarly, although the invention has been shown and described with respect to exemplary embodiments thereof, it should be understood by those skilled in the art that the foregoing and various other changes, omissions and additions may be made therein and thereto, without departing from the spirit and the scope of the invention.

We claim:

1. A surface acoustic wave signal processor employing programmable internal product mixer efficiency, comprising:
    a piezoelectric and semiconductive substrate;
    means for launching a pair of acoustoelectric waves in said substrate along a propagation path adjacent to a surface of said substrate;
    a plurality of taps disposed on said surface along said propagation path, each of said taps including at least one drain electrode having an ohmic contact with said substrate, the drain electrodes of each tap being isolated from the drain electrodes of the other taps, at least one gate electrode having a rectifying contact with said substrate, and at least one source electrode having an ohmic contact with said substrate, the source electrodes of all the taps being connected together;
    programmable means for separately providing to each of said taps a source-drain bias between a drain of the corresponding one of said taps and said common source, said programmable means providing bias to each tap of amplitude and polarity to respectively control the amplitude and phase of the mixer efficiency of nonlinear product mixing of said waves in the region of said substrate contiguous with such tap; and
    output means associated with said taps for extracting from each of said taps a component of product mixing occurring at such tap;
    characterized by:
    the gate electrodes of each tap being ohmically isolated; and
    said output means comprising an RF coupling to said common source.

2. A surface acoustic wave phase and amplitude programmable transversal filter employing programmable internal product mixer efficiency, comprising:
    a piezoelectric and semiconductive substrate;
    means for launching a pair of acoustoelectric waves in said substrate along a propagation path adjacent to a surface of said substrate;
    a plurality of taps disposed on said surface along said propagation path, each of said taps including at least one drain electrode having an ohmic contact with said substrate, the drain electrodes of each tap being isolated from the drain electrodes of the other taps, at least one gate electrode having a rectifying contact with said substrate, and at least one source electrode having an ohmic contact with said substrate, the source electrodes of the taps being connected together; and
    programmable means for separately providing to each of said taps a source-drain bias between a drain of the corresponding one of said taps and said common source, said programmable means providing bias to each tap of amplitude and polarity to respectively control the amplitude and phase of the mixer efficiency of nonlinear product mixing of said waves in the region of said substrate contiguous with such tap;
    characterized by:
    the gate electrodes of each tap being ohmically isolated; and
    output means RF coupled to said common source to provide an output signal.

* * * * *